United States Patent
Magnus et al.

(10) Patent No.: US 9,458,012 B2
(45) Date of Patent: Oct. 4, 2016

(54) METHOD FOR SHIELDING MEMS STRUCTURES DURING FRONT SIDE WAFER DICING

(71) Applicant: FREESCALE SEMICONDUCTOR, INC., Austin, TX (US)

(72) Inventors: Alan J. Magnus, Gilbert, AZ (US); Vijay Sarihan, Paradise Valley, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 282 days.

(21) Appl. No.: 14/182,736

(22) Filed: Feb. 18, 2014

(65) Prior Publication Data

US 2015/0232332 A1 Aug. 20, 2015

(51) Int. Cl.
*B81C 1/00* (2006.01)
(52) U.S. Cl.
CPC ....... *B81C 1/00888* (2013.01); *B81C 1/00896* (2013.01)
(58) Field of Classification Search
CPC .................................................. B81C 1/00896
See application file for complete search history.

(56) References Cited

U.S. PATENT DOCUMENTS

| 6,555,417 | B2 | 4/2003 | Spooner et al. |
| 6,759,273 | B2 | 7/2004 | Felton et al. |
| 6,946,326 | B2 | 9/2005 | Spooner et al. |
| 6,946,366 | B2 | 9/2005 | Spooner et al. |
| 7,022,546 | B2 | 4/2006 | Spooner et al. |
| 7,297,567 | B2 | 11/2007 | Loeppert |
| 7,713,772 | B2 * | 5/2010 | Vanha et al. ............ 438/53 |
| 2007/0031989 | A1 * | 2/2007 | Knechtel et al. ............ 438/68 |

* cited by examiner

*Primary Examiner* — Robert Bachner
*Assistant Examiner* — Toniae Thomas
(74) *Attorney, Agent, or Firm* — Charlene R. Jacobsen

(57) ABSTRACT

A method includes applying a compressive force against MEMS structures at a front side of a MEMS wafer using a protective material covering at least a portion of the front side of the MEMS wafer. The method further includes concurrently dicing through the protective material and the MEMS wafer from the front side to produce a plurality of MEMS dies, each of which includes at least one of the MEMS structures. The protective material is secured over the front side of the MEMS wafer to apply pressure to the protective material, and thereby impart the compressive force against the MEMS structures to largely limit movement of the MEMS structures during dicing. A tack-free surface of the protective material enables its removal following dicing.

7 Claims, 10 Drawing Sheets

METHOD FOR SHIELDING MEMS STRUCTURES DURING FRONT SIDE WAFER DICING

TECHNICAL FIELD OF THE INVENTION

The present invention relates generally to the processing of microelectromechanical systems (MEMS) devices. More specifically, the present invention relates to protecting MEMS structures on a MEMS wafer during wafer dicing.

BACKGROUND OF THE INVENTION

Microelectronic and microelectromechanical systems (MEMS) technology has achieved wide popularity in recent years, as it provides a way to make very small electronic and mechanical structures and integrate these structures on a single substrate using conventional batch semiconductor processing techniques. While such microelectronic and MEMS devices are becoming mainstream technologies, cost effectively protecting the delicate MEMS structures from damage and/or contamination during wafer processing remains challenging.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Embodiments of the present invention entail methodology for shielding MEMS structures during dicing of a MEMS wafer in order to protect the MEMS structures from damage and particle contamination during a wafer dicing process. In particular, embodiments entail a fabrication operation in which a compressive force is applied against the MEMS structures using a temporary protective material. A dicing operation concurrently dices through both of the protective material and the MEMS wafer. The protective material has a tack-free surface facing the MEMS structures. The compressive force largely limits excessive movement of the movable MEMS structures, thus making the MEMS structures less susceptible to fracture from either a point force as well as being restricted from fracture due to back and forth pulsation from the impact of the water spray during the dicing operation. Additionally, the protective material provides a physical barrier to the impact of the water spray and/or saw debris. Furthermore, since the protective material is tack-free, it cannot adhere to the MEMS structures on the front side of the MEMS wafer. Accordingly, following dicing, the protective material can simply be removed from the front side of the singulated MEMS dies, and the MEMS dies can continue on to the next step of processing. Thus, the methodology yields cost effective means for protecting the delicate MEMS structures from damage and/or contamination during front side wafer dicing.

Figure 1:
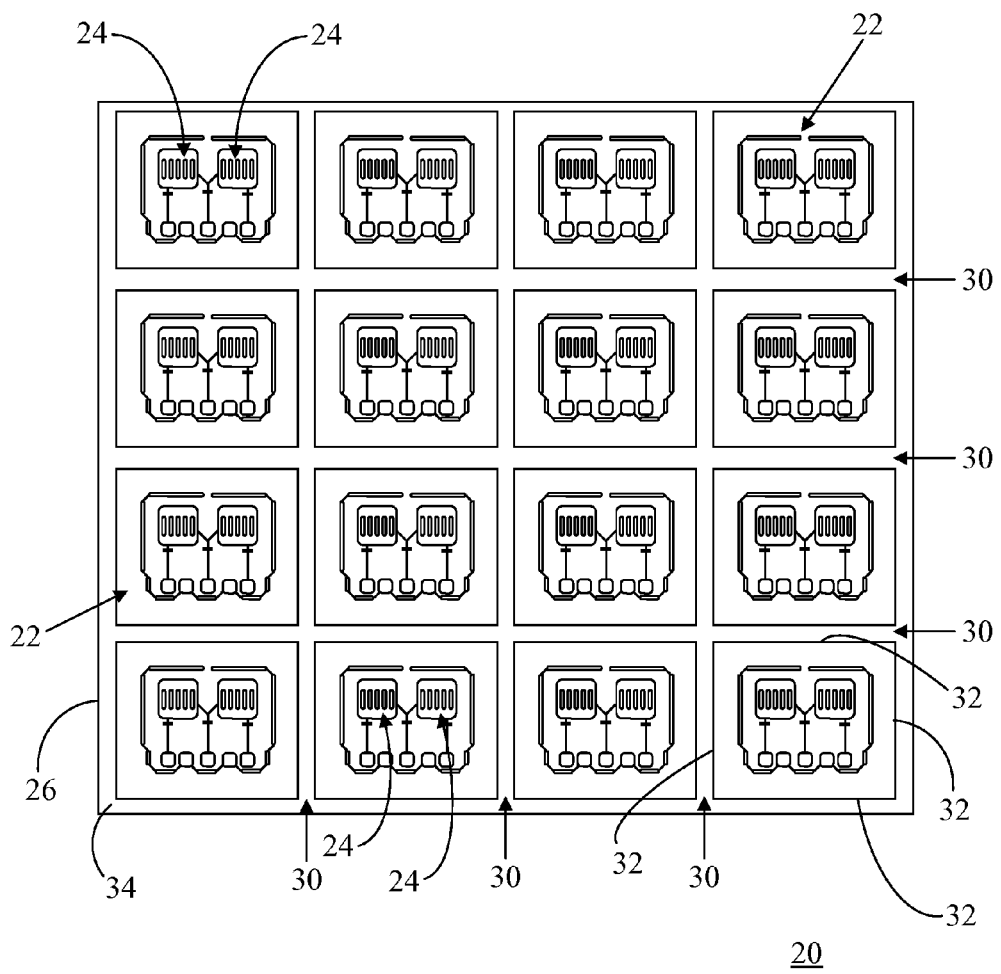
FIG. 1 shows a partial top view of a microelectromechanical systems (MEMS) wafer.
Figure 2:
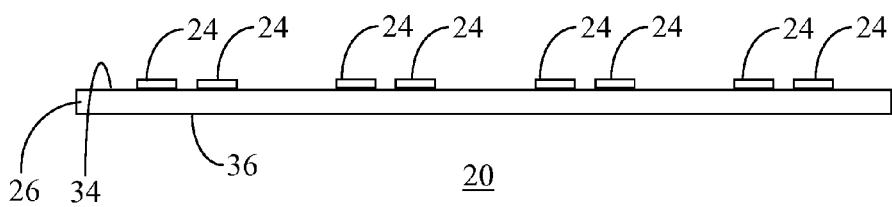
FIG. 2 shows a partial side view of the MEMS wafer of FIG. 1.

Referring to FIGS. 1 and 2, FIG. 1 shows a partial top view of a microelectromechanical systems (MEMS) wafer 20 and FIG. 2 shows a partial side view of MEMS wafer 20. MEMS wafer 20 is typically fabricated to include a plurality of MEMS dies 22, each of which includes one or more MEMS structures 24 formed on, for example, a silicon wafer 26. These MEMS structures 24 perform a particular function in accordance with particular design requirements. MEMS dies 22 are typically arranged in a grid pattern, and the sections of MEMS wafer 20 between the individual MEMS dies 22 are termed saw streets 30, or scribe streets. Saw streets 30 are areas of MEMS wafer 20 where no active components of MEMS structures 24 have been placed and which define a perimeter 32, or boundary, of each MEMS die 22.

MEMS structures 24 typically appear on only one surface, referred to herein as a front side 34, of MEMS wafer 20. The opposing surface, referred to herein as a back side 36, of MEMS wafer 20 may be devoid of structures or patterns. The individual MEMS dies 22 are removed from MEMS wafer 20 by sawing or dicing MEMS wafer 20 along all of saw streets 30, thus physically separating MEMS wafer 20 along both axes into individual, or singulated, MEMS dies 22.

An industry standard practice for separating MEMS wafer 20 into individual MEMS dies 22 entails securing MEMS wafer 20 onto dicing tape, or film, and into a dicing frame, or film frame, with front side 34 containing MEMS structures 24 being exposed and facing upward. The film frame is secured on a movable chuck in a sawing station. The chuck and MEMS wafer 20 are then advanced under a saw blade to dice, or cut, MEMS wafer 20 from front side 34 along saw streets 30. During the dicing process, water is jet sprayed over front side 34 of MEMS wafer 20, as well as over the surface of the saw blade to cool MEMS wafer 20 and the saw blade. After the dicing operation, the diced MEMS wafer 20 is transported to a cleaning station where it can be rinsed with de-ionized water and, in some cases, brushed, to clear away any remaining slurry created by the dicing operation. The diced MEMS wafer 20 is then dried after the water flow and brushing operations are complete.

After cleaning, the film frame containing the now singulated MEMS dies 22 is transported to a pick-and-place station where the individual MEMS dies 22 are to be removed from the film frame. The pick-and-place station removes the individual MEMS dies 22 from the film frame and places them, for example, into a carrier. The MEMS dies 22 can then be delivered in the carrier to the next station for further processing.

Each MEMS die 22 may contain any type and combination of MEMS structures 24 including, but not limited to, movable masses for accelerometers and gyroscopes, sense diaphragms for pressure sensors, switches, optical mirrors, and so forth. Each MEMS die 22 may also include other circuitry associated with MEMS structures 24. When MEMS dies 22 are fabricated, the circuitry portion of MEMS dies 22 may be coated with a passivation layer to protect it. However, MEMS structures 24 cannot be passivated since they must be able to move freely in response to a particular stimulus.

MEMS structures 24 can be very fragile and great care must be taken during fabrication and packaging so that MEMS structures 24 are not damaged or contaminated. Unfortunately, the water jet spray used during a dicing process can damage the delicate MEMS structures 24. Those MEMS structures 24 that survive the water jet spray may subsequently be damaged during the ensuing rinsing and/or brushing that occurs during the cleaning process. For example, when MEMS structures 24 are diaphragms for pressure sensors, experimentation has shown a direct correlation between fractures in the fragile diaphragms and the impact of saw cut water and/or rinse water onto the MEMS die 22 surface, i.e., front side 34.

Figure 3:
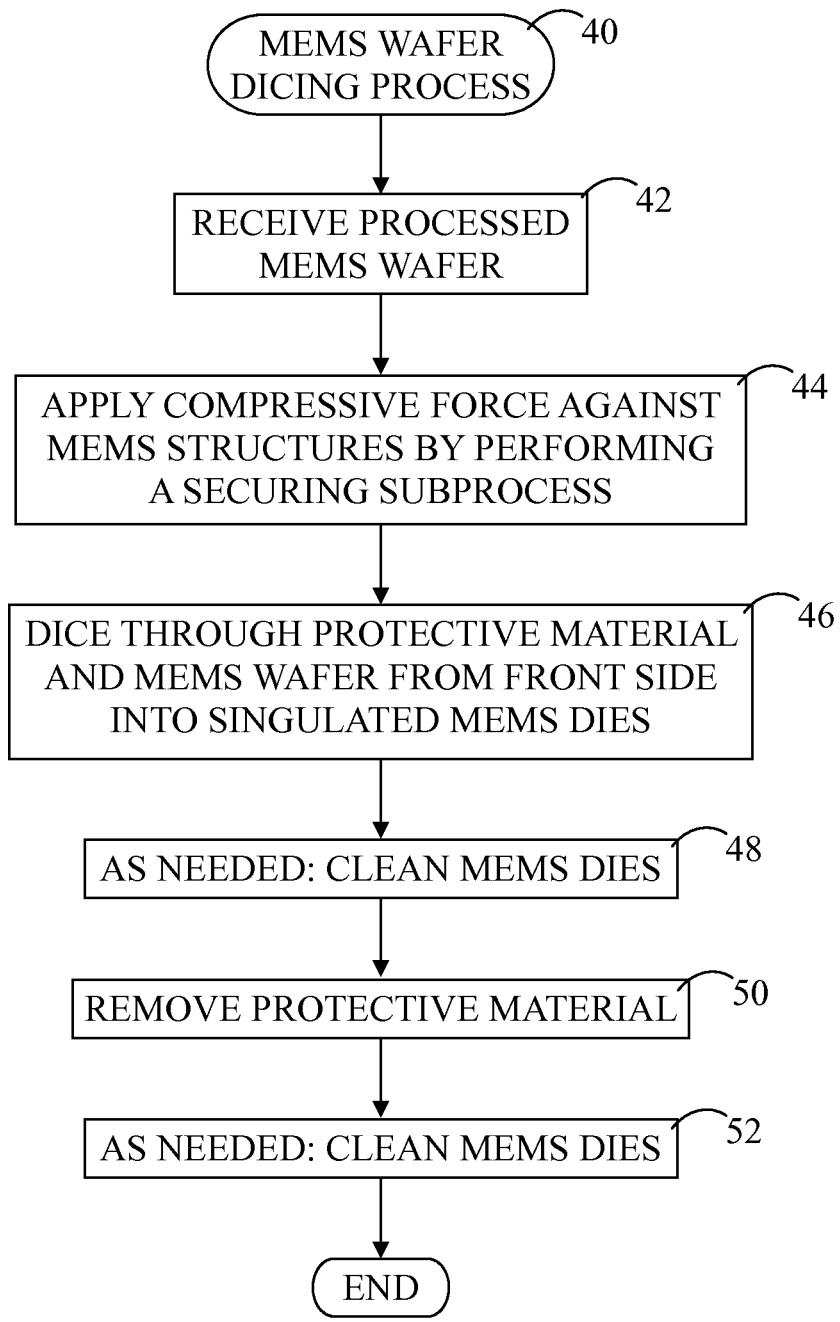
FIG. 3 shows a flowchart of a MEMS wafer dicing process in accordance with an embodiment.

FIG. 3 shows a flowchart of a MEMS wafer dicing process 40 in accordance with an embodiment. MEMS wafer dicing process 40 enables the dicing of a MEMS wafer into a plurality of MEMS dies while effectively protecting the fragile MEMS structures during the dicing process, and thereby increasing yield. For clarity of description, MEMS wafer dicing process 40 will be discussed in connection with dicing MEMS wafer 20 (FIGS. 1 and 2) into a plurality of singulated MEMS dies 22 (FIG. 1). Therefore reference may be made to FIGS. 1 and 2 in connection with the ensuing discussion of MEMS wafer dicing process 40.

MEMS wafer dicing process 40 may begin with a task 42. A processed MEMS wafer, e.g., MEMS wafer 20, is received (42). MEMS wafer 20 may be received from another manufacturing facility that originally fabricated MEMS wafer 20, and is received at the facility that will be performing subsequent dicing and post processing activities. Alternatively, MEMS wafer 20 may be fabricated at the facility that is additionally performing the dicing and post processing activities.

Next at a task 44, compressive force is applied against MEMS structures 24 at front side 34 of MEMS wafer 20 using a protective material covering at least a portion of front side 34 of MEMS wafer 20. More particularly, compressive force is applied by performing a securing subprocess in order to secure a protective material over front side 34 of MEMS wafer 20. Pressure is applied to the protective material thereby imparting the compressive force against MEMS structures 24. For purposes of clarity, a securing subprocess is performed at task 44 to enable the application of compressive force against MEMS structures. In accordance with an embodiment, a securing subprocess will be presented in connection with a description of FIGS. 4-11 below. Another securing subprocess will be presented in connection with a description of FIGS. 15-19 below. And yet another securing subprocess will be presented in connection with a description of FIGS. 20-23 below.

Regardless of the particular methodology implemented to apply the compressive force using a protective material, following task 44, a task 46 is performed. MEMS wafer 20 is diced from front side 34 into singulated MEMS dies 22 (46). As will be discussed in greater detail connection with FIGS. 12, 13, and 23, the dicing process concurrently dices through the protective material overlying MEMS structures 24 and through MEMS wafer 20. Due to the presence of the protective material and the compressive force applied via the protective material, excessive movement of MEMS structures 24 is largely limited, thus making MEMS structures 24 less susceptible to fracture from either a point force as well as being less susceptible to fracture due to back and forth pulsation from the impact of the water spray during the dicing operation. Additionally, the protective material provides a physical barrier to the impact of the water spray and/or saw debris.

Next, a task 48 is performed as needed to clean the now singulated MEMS dies 22. Such cleaning may be performed to remove slurry and/or other debris from the protective material which is still largely in place over MEMS structures 24.

Next, a task 50 is performed to remove the protective material. In embodiments discussed below, the protective material has a tack-free surface facing MEMS structures 24. At task 50, this protective material may simply be lifted off of the now singulated MEMS dies 22 since it is not physically adhered to front side 34 or MEMS structures 24.

A task 52 may be performed as needed after removing the protective material to clean the now singulated MEMS dies 22. For example, following removal of the protective material, a low pressure atomized rinse may be applied to front side 34 of MEMS dies 22 so as to clean MEMS dies 22 (52). Since the protective material was removed at the prior task 50, the low pressure atomized rinse may serve to limit damage to the fragile MEMS structures 24. Accordingly, rinse task 48 may be performed before the protective material is removed from MEMS structures 24 or rinse task 52 may be performed after the protective material is removed from MEMS structures 24. Alternatively, both rinse task 48 and rinse task 52 may be performed in some embodiments.

Figure 4:
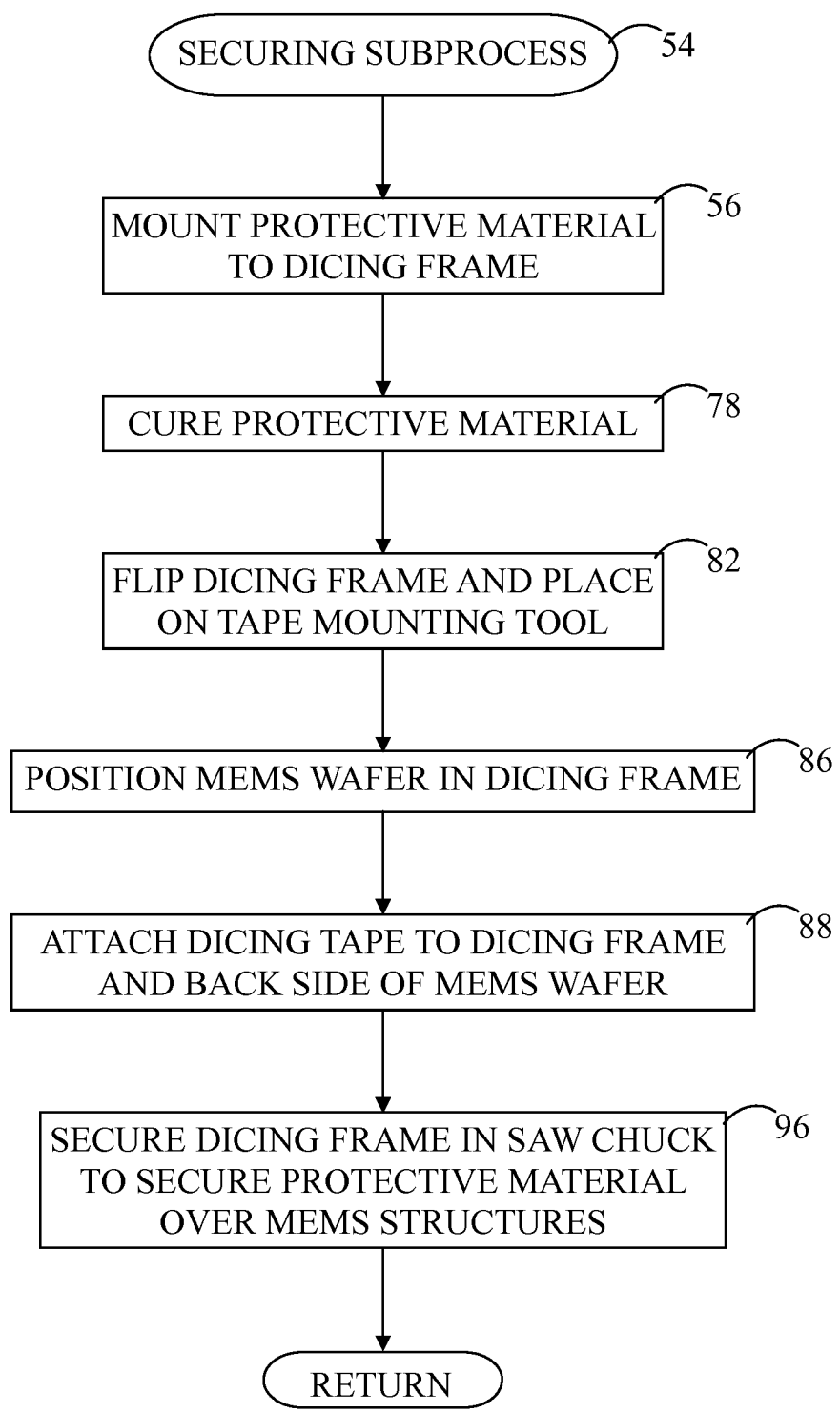
FIG. 4 shows a flowchart of a securing subprocess that may be executed in connection with the MEMS wafer dicing process of FIG. 3 in accordance with an embodiment.

FIG. 4 shows a flowchart of a securing subprocess 54 that may be executed in connection with MEMS wafer dicing process 40 (FIG. 3) in accordance with an embodiment. More particularly, securing subprocess 54 may be performed to enable the application of compressive force against MEMS structure 24 at task 44 of MEMS wafer dicing process 40.

Securing subprocess 54 includes task 56. A protective material is mounted to a dicing frame (56).

Figure 5:
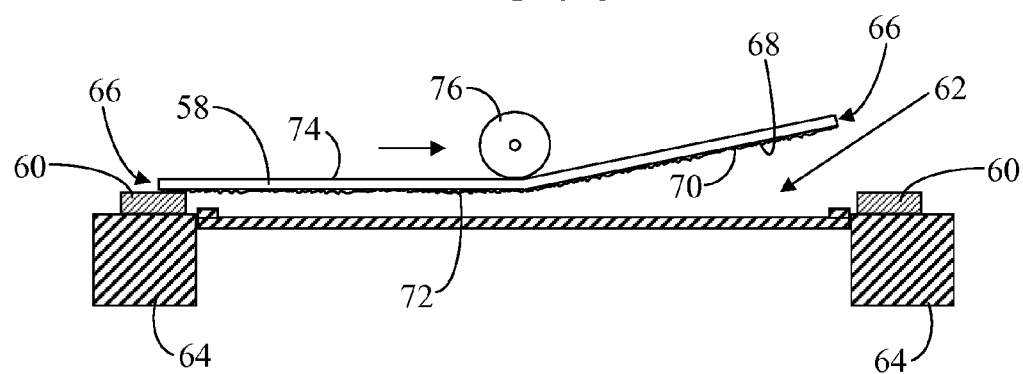
FIG. 5 shows a side view of a protective material being mounted to a dicing frame during processing in accordance with the securing subprocess of FIG. 4.

Referring to FIG. 5 in connection with task 56, FIG. 5 shows a side view of a protective material 58 being mounted to a dicing frame 60 during processing in accordance with securing subprocess 54. As exemplified in FIG. 5, dicing frame 60 having a central opening 62 is placed on a taping structure 64. Protective material 58 is laid over dicing frame 60, and a periphery 66 of a surface 68 of protective material 58 is mounted to dicing frame 60. Protective material 58 may be a flexible film material of, for example, polyimide, polyolefin, or any other suitable material.

In an embodiment, surface 68 may include an adhesive 70. Accordingly, in order to mount protective material 58 to dicing frame 60, an adhesive region of surface 68, i.e. periphery 66 having adhesive 70, is attached to dicing frame 60 such that a remainder 72 of protective material 58 spans central opening 62 of dicing frame 60. That is, force may be applied to another surface 74 of protective material 58 via, for example, a rolling cylinder 76 to adhere periphery 66 of protective material 58 to dicing frame 60.

With reference back to securing subprocess 54 (FIG. 4), a task 78 may be performed following mounting task 56. Protective material 58 spanning central opening 62 of dicing frame 60 is cured (78).

Figure 6:
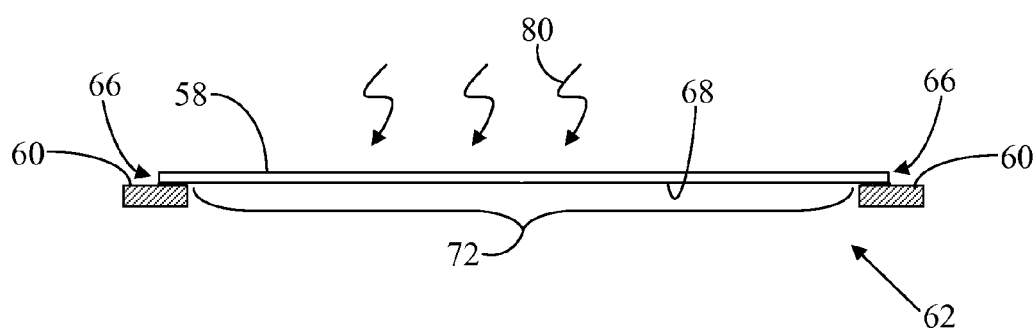
FIG. 6 shows a side view of the protective material and dicing frame of FIG. 5 during a subsequent stage of processing in accordance with the securing subprocess of FIG. 4.

Referring to FIG. 6, FIG. 6 shows a side view of protective material 58 and dicing frame 60 of FIG. 5 during a subsequent stage of processing in accordance with task 78 of securing subprocess 54. In an embodiment, surface 68 that is not attached to dicing frame 60, i.e. remainder 72 of protective material 58 spanning central opening 62 should be tack-free so as to not adhere to MEMS structures 24 (FIG. 1) in subsequent processing operations. In an embodiment, adhesive 70 (FIG. 5) on surface 68 of protective material 58 may be ultraviolet (UV) curable. As such, protective material 58 can undergo a photochemical process at task 78 in which ultraviolet light 80 can be used to instantly cure or "dry" adhesive 70 that spans central opening 62 so that adhesive 70 is no longer tacky. Periphery 66 of protective material 58 that is attached to dicing frame 60 should not be cured. Otherwise, protective material 58 could become detached from dicing frame 60.

Although UV curing is described herein, those skilled in the art will recognize that other processes may be performed to make remainder 72 of protective material 58 tack-free. Alternatively, the entire surface 68 of protective material 58 may initially be tack-free. When such is the case, an adhesive may be applied to dicing frame 60 and/or periphery 66 of protective material 58 so that protective material 58 can be mounted to dicing frame 60.

Referring back to FIG. 4, a task 82 may be performed following curing task 78. Dicing frame 60 with the attached protective material 58 is flipped and placed on a tape mounting tool, i.e., taping structure 64 (82).

Figure 7:
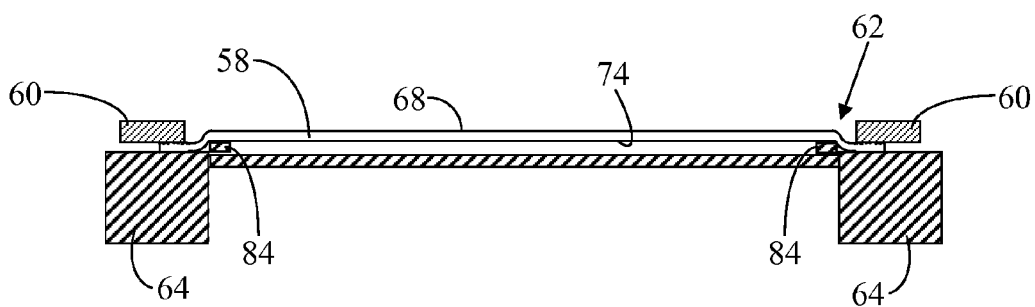
FIG. 7 shows a side view of the protective material and dicing frame of FIG. 6 during a subsequent stage of processing in accordance with the securing subprocess of FIG. 4.

FIG. 7 shows a side view of protective material 58 and dicing frame 60 of FIG. 6 during a subsequent stage of processing in accordance with task 82 of securing subprocess 54 (FIG. 4). As shown in FIG. 7, dicing frame 60 and protective material 58 have been flipped and placed on taping structure 64 so that the now tack-free surface 68 of protective material spanning central opening 62 of dicing frame 60 is facing upwardly. It should be additionally noted, that protective material 58 may rest on and be stretched by stop elements 84 of taping structure 64 when dicing frame 60 is placed on taping structure 64.

Referring back to FIG. 4, securing process 54 may include a task 86 following task 82. MEMS wafer 20 (FIG. 1) is positioned in dicing frame 60 (86).

Figure 8:
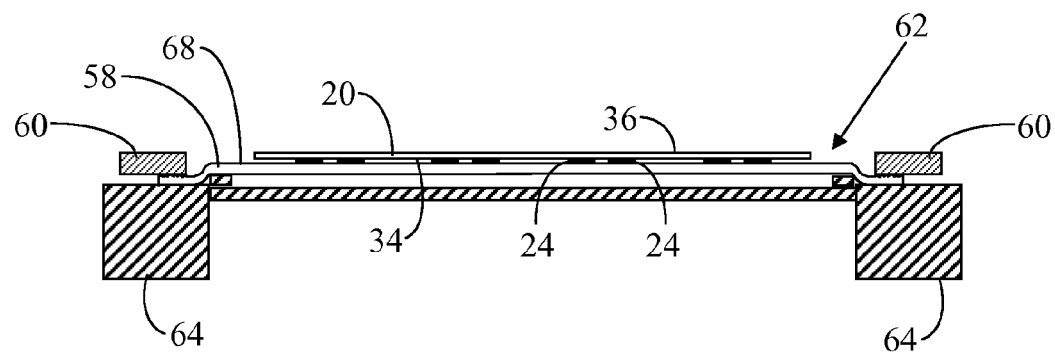
FIG. 8 shows a side view of the MEMS wafer of FIG. 1 positioned in a central opening of the dicing frame of FIG. 7 during a subsequent stage of processing in accordance with the securing subprocess of FIG. 4.

FIG. 8 shows a side view of MEMS wafer 20 positioned in central opening 62 of dicing frame 60 during a subsequent stage of processing in accordance with task 86 of securing subprocess 54 (FIG. 4). As shown, MEMS wafer 20 is positioned in central opening 62 such that MEMS structures 24 at front side 34 of MEMS wafer 20 face tack-free surface 68 of protective material 58. As such, back side 36 of MEMS wafer 20 is now facing upwardly in the illustration.

Referring back to FIG. 4, securing process 54 may include a task 88 following task 86. Dicing tape is attached to dicing frame 60 and back side of MEMS wafer 20 (FIG. 1) (88).

Figure 9:
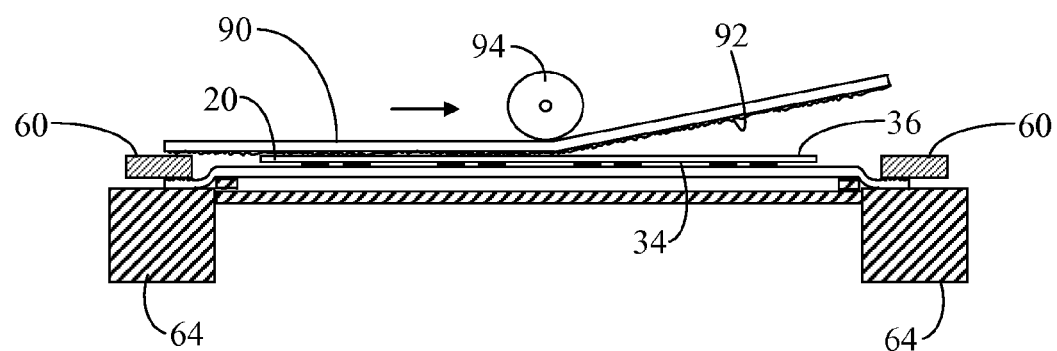
FIG. 9 shows a side view of dicing tape being attached to a back side of the MEMS wafer from FIG. 8 during a subsequent stage of processing in accordance with the securing subprocess of FIG. 4.

FIG. 9 shows a side view of dicing tape 90 being attached to back side 36 of MEMS wafer 20 during a subsequent stage of processing in accordance with task 88 of securing subprocess 54 (FIG. 4). As exemplified in FIG. 9, back side 36 of MEMS wafer 20 is located in taping structure 64 with front side 34 of MEMS wafer 20 facing downwardly and back side 36 of MEMS wafer 20 facing upwardly. A plastic film, i.e., dicing tape 90, is laid over dicing frame 60 and back side 36 of MEMS wafer 20. Dicing tape 90 typically includes an adhesive layer 92 on the side that contacts dicing frame 60 and MEMS wafer 20. Force is then applied to dicing tape 90 via, for example, a rolling cylinder 94, to attach dicing tape 90 to back side 36 of MEMS wafer 20 and to secure dicing tape 90 to dicing frame 60. MEMS wafer 20 is now mounted to dicing tape 90 that, in turn, is mounted to dicing frame 60.

Figure 10:
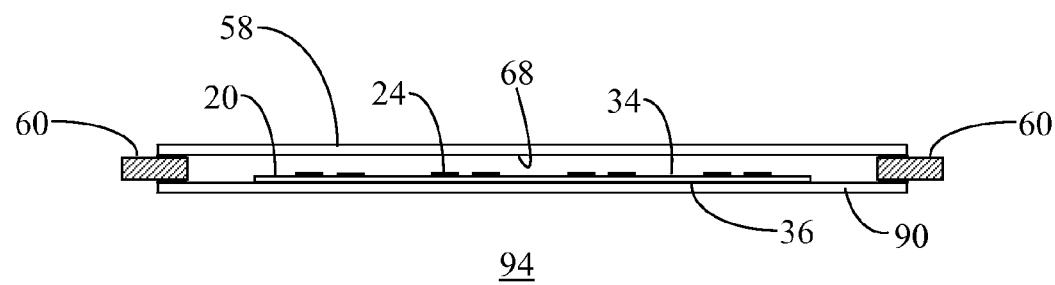
FIG. 10 shows a side view of a sandwich structure of the MEMS wafer, the protective material, and the dicing tape from FIG. 9 during a subsequent stage of processing in accordance with the securing subprocess of FIG. 4.

FIG. 10 shows a side view of a sandwich structure 94 of MEMS wafer 20, protective material 58, and dicing tape 90 from FIG. 9 during a subsequent stage of processing in accordance with securing subprocess 54 (FIG. 4). More particularly, FIG. 10 shows sandwich structure 94 following taping task 88. As exemplified in the illustration, sandwich structure 94 is flipped such that front side 34 of MEMS wafer 20 is facing upwardly, and back side 36 of MEMS wafer 20, which is adhered to dicing tape 90, is facing downwardly.

It should be recalled that surface 68 of protective material 58 spanning central opening 62 of dicing frame 60 is tack-free. That is, adhesive layer 70 (FIG. 5) was UV cured so that it is no longer sticky or tacky. Accordingly, after sandwich structure 94 is removed from taping structure 64, protective material 58 may move away from MEMS structures 24 on front side 34 of MEMS wafer 20, at least by the thickness of dicing frame 60. Since protective material 58 does not adhere to MEMS structures 24, the fragile MEMS structures 24 will be less subject to damage from adhesion to and subsequent release from an adhesive material that could otherwise be present on surface 68 of protective material 58.

Now returning to FIG. 4, securing process 54 can include a task 96 following task 88. At task 96, dicing frame 60 is secured to a movable saw chuck in order to secure protective material 58 over MEMS structures 24 of MEMS wafer 20.

Figure 11:
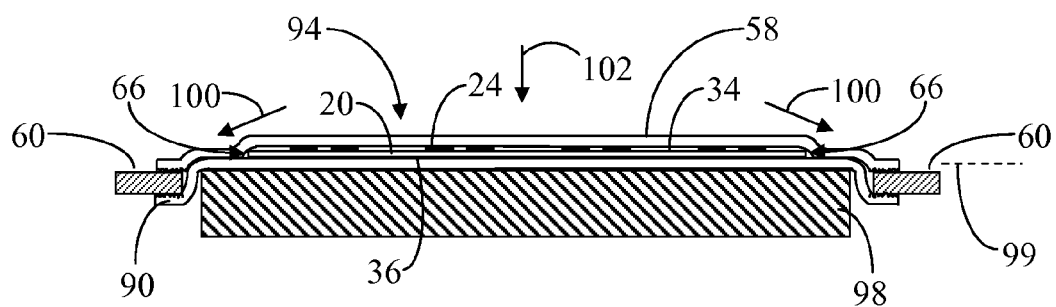
FIG. 11 shows a side view of the sandwich structure from FIG. 10 secured in a saw chuck during a subsequent stage of processing in accordance with the securing subprocess of FIG. 4.

FIG. 11 shows a side view of sandwich structure 94 secured in a saw chuck 98 during a subsequent stage of processing in accordance with task 96 of securing subprocess 54 (FIG. 4). In particular, FIG. 10 shows sandwich structure 94 placed on movable saw chuck 98 with back side 36 of MEMS wafer 20 facing saw chuck 98. Dicing tape 90 may be secured to saw chuck 98 via vacuum and/or, in some instances via an adhesive material (not shown) present on either of saw chuck 98 or on dicing tape 90. Dicing tape 90 and dicing frame 86 may alternatively be secured to saw chuck 98 by other means.

In an embodiment, a clamp (not shown) of saw chuck 98 can pull dicing frame 60 below a dicing plane 99 of saw chuck 98. This clamping action can apply pressure, represented by outwardly directed arrows 100, to periphery 66 of protective material 58. This pressure 100 causes protective material 58 to be pulled against MEMS structures 24 on front side 34 of MEMS wafer 20 so as to impart a compressive force, represented by a downwardly directed arrow 102, against MEMS structures 24.

Referring back to FIG. 4, after dicing frame 60 is secured in saw chuck 98 at securing task 96, securing subprocess 54 may be complete, and processing returns to MEMS wafer dicing process 40 (FIG. 3). In particular, MEMS wafer 20 is now ready to be diced in accordance with task 46 (FIG. 3) of MEMS wafer dicing process 40. In particular, MEMS wafer 20 undergoes a front side dice process.

Figure 12:
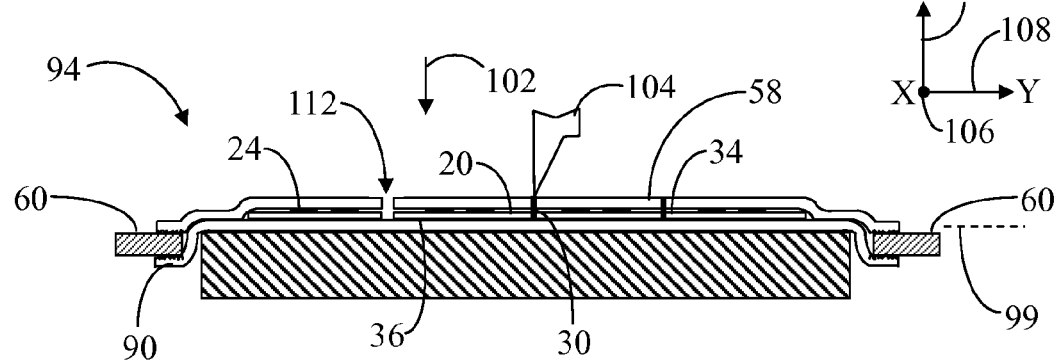
FIG. 12 shows a side view of the sandwich structure from FIG. 11 during a dicing operation in accordance with the MEMS wafer dicing process of FIG. 3.

FIG. 12 shows a side view of sandwich structure 94 from FIG. 11 during a dicing process in accordance with task 46 of MEMS wafer dicing process 46 (FIG. 3). In particular, FIG. 12 shows a saw blade 104 of a conventional sawing machine dicing, cutting, or otherwise concurrently sawing through protective material 58 and through MEMS wafer 20 from front side 34 along saw streets 30. Compressive force 102 imparted on MEMS structures 24 using protective material 58, largely limits movement of the typically movable MEMS structures 24. That is, protective material 58 serves as a mechanical stop, thus dampening any movement of MEMS structures 24. While held in this position, MEMS structures 24 are less susceptible to fracture from a point force. Furthermore, MEMS structures 24 are less susceptible to fracture due to the back and forth pulsation from impact of the water spray during the saw process.

MEMS wafer 20 may include indicia on front side 34 or some other alignment key corresponding with saw streets 30. The sawing machine may include a camera and a computerized optical system using optical pattern recognition software to control movement of saw chuck 98 so as to align saw streets 30 on MEMS wafer 30 with saw blade 104. However, the movement of saw chuck 98 may alternatively be controlled manually, and saw chuck 98 and MEMS wafer 20 may be advanced under saw blade 104 to dice through MEMS wafer 20 at saw streets 30.

In the embodiment shown in FIG. 12, dicing operation 46 (FIG. 3) may be performed in one direction across dicing plane 99 of MEMS wafer 20, for example, substantially parallel to an X-axis 106 in a three dimensional coordinate system. In the side view illustration of FIG. 12, a Y-axis 108 is oriented left-to-right on the page, a Z-axis 110 is oriented up-and-down on the page, and X-axis 106 is represented as a dot that depicts an axis going either into or out of the page on which FIG. 12 is situated.

It should be recalled, however, that dicing task 46 concurrently dices through protective material 58 and MEMS wafer 20. As such, dicing task 46 results in the formation of openings 112 extending through protective material 58. Accordingly, after MEMS wafer 20 has been diced along all saw streets 30 that are parallel to X-axis 106, another layer of protective material may be secured over protective material 58, saw chuck 98 may be rotated approximately ninety degrees, and dicing task 46 may continue by dicing MEMS wafer 20 in a direction substantially parallel to, for example, Y-axis 108.

Figure 13:
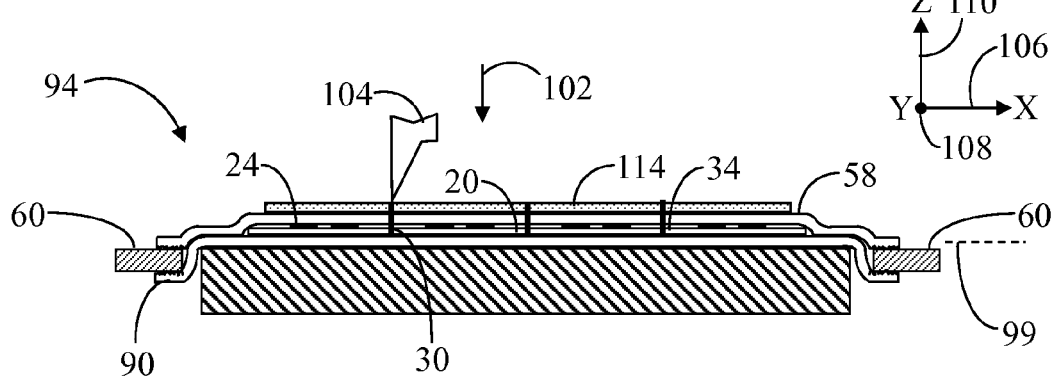
FIG. 13 shows a side view of the sandwich structure from FIG. 12 during the dicing operation in accordance with the MEMS wafer dicing process of FIG. 3.

FIG. 13 shows a side view of sandwich structure 94 from FIG. 12 during dicing in accordance with task 46 of MEMS wafer dicing process 40 (FIG. 3). In particular, FIG. 13 shows a protective material 114 (represented by a stippled pattern) placed over protective material 58. Protective material 114 may be adhered to protective material 58, adhered to dicing frame 60, or secured by any suitable means. Saw chuck 98 with the attached dicing frame 60 has been rotated ninety degrees relative to saw blade 104. Thus, protective material 114, protective material 58, and MEMS wafer 20 can now be diced along all saw streets 30 that are parallel to Y-axis 108. Due to the presence of protective materials 58 and 114, some compressive force 102 may still be applied to MEMS structures 24 thus preventing or limiting damage to them during dicing.

Figure 14:
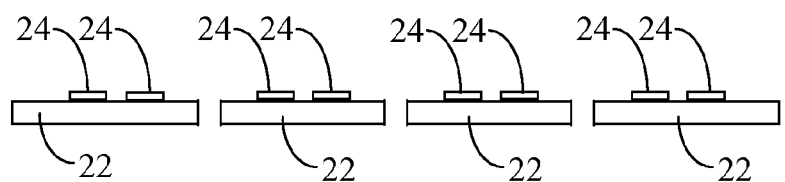
FIG. 14 shows a side view of singulated MEMS dies following dicing of the MEMS wafer of FIG. 1 in accordance with the MEMS wafer dicing process of FIG. 3.

FIG. 14 shows a side view of singulated MEMS dies 22 following dicing of MEMS wafer 20 (FIG. 1) in accordance with MEMS wafer dicing process 40 (FIG. 3). After dicing task 46, the diced MEMS wafer 20, now in the form of individual MEMS dies 22 may be transported to a cleaning station where front side 34 can be rinsed, in accordance with tasks 48 and/or 52 of MEMS wafer dicing process 40, and protective materials 58 and 114 can be removed, in accordance with task 50 of MEMS wafer dicing process 40. After cleaning and removing protective materials 58 and 114, dicing frame 60 and dicing tape 90 containing the now singulated MEMS dies 22 may be transported to a pick-and-place station where the individual MEMS dies 22 can be removed from dicing tape 90. The pick-and-place station may remove the individual MEMS dies 22 from dicing tape 90 and place them, for example, into a carrier (not shown). MEMS dies 22 may then be delivered in the carrier to the next station for further processing.

Figure 15:
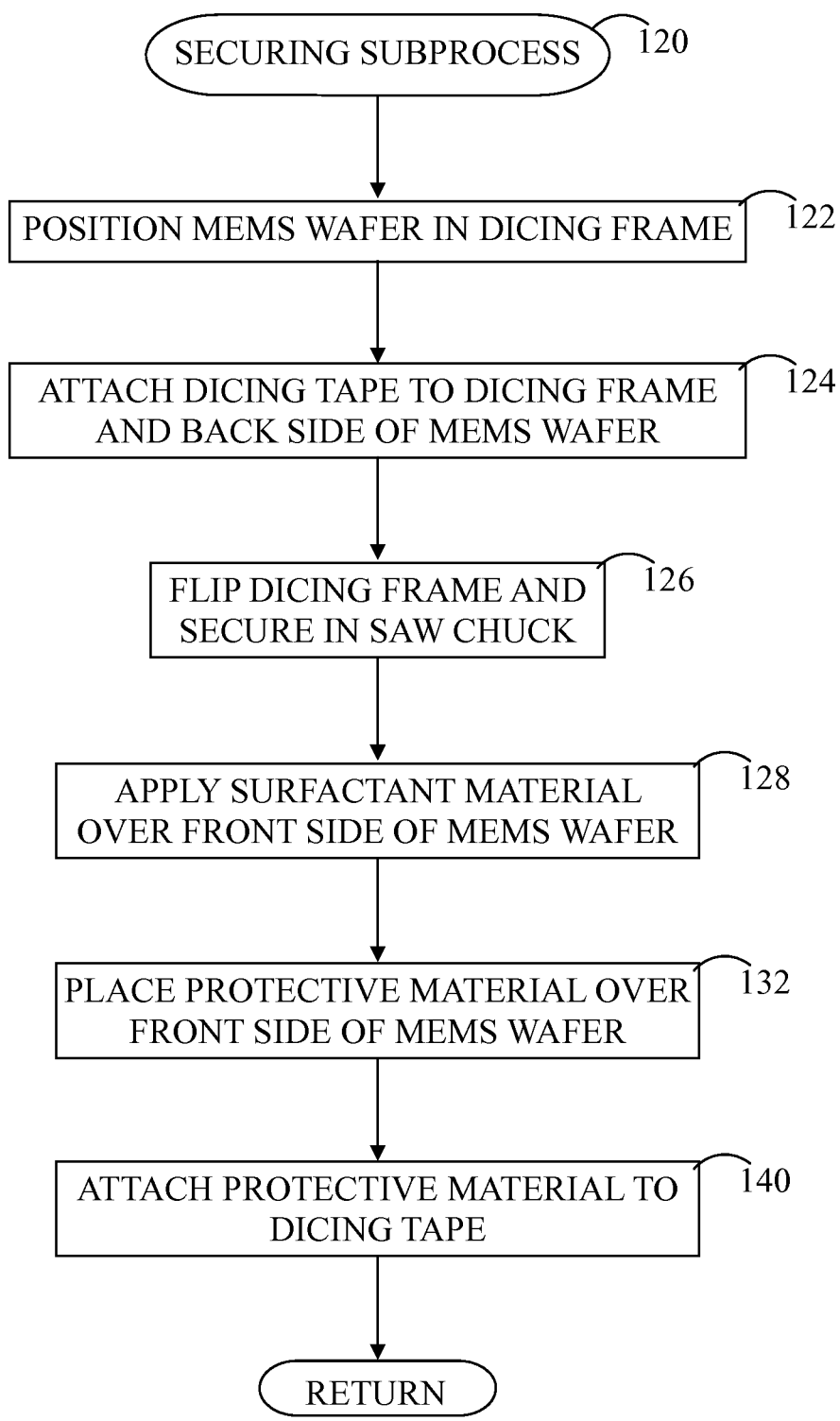
FIG. 15 shows a flowchart of a securing subprocess that may be executed in connection with the MEMS wafer dicing process of FIG. 3 in accordance with another embodiment.

FIG. 15 shows a flowchart of a securing subprocess 120 that may be executed in connection with task 44 (FIG. 3) of MEMS wafer dicing process 40 (FIG. 3) in accordance with another embodiment. More particularly, securing subprocess 120 may be performed to enable the application of compressive force against MEMS structures 24 at task 44 of MEMS wafer dicing process 40.

Securing subprocess 120 may begin with a task 122. MEMS wafer 20 is placed in a dicing frame (122). A task 124 may be performed in conjunction with task 122. Dicing tape is attached to the dicing frame and to the back side of MEMS wafer 20 (124).

Figure 16:
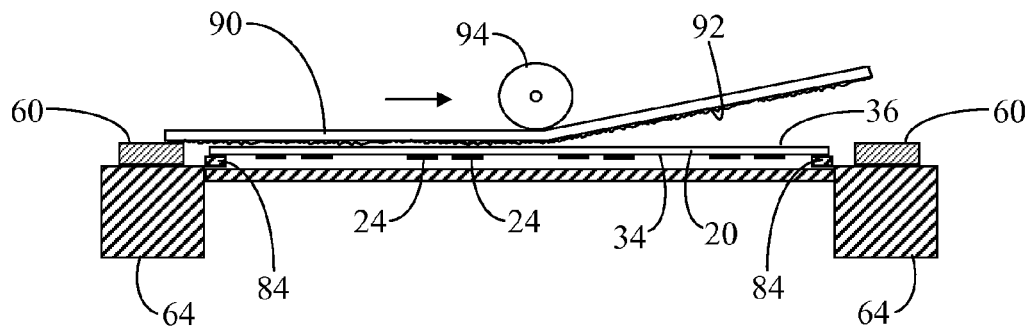
FIG. 16 shows a side view of a dicing tape being attached to a dicing frame and a back side of the MEMS wafer of FIG. 1 during processing in accordance with the securing subprocess of FIG. 15.

Referring to FIG. 16 in connection with tasks 122 and 124, FIG. 16 shows a side view of dicing tape 90 being attached to dicing frame 60 and to back side 36 of MEMS wafer 20, which is positioned in dicing frame 60, during a subsequent stage of processing in accordance with tasks 122 and 124 of securing subprocess 120 (FIG. 15). As exemplified in FIG. 16, back side 36 of MEMS wafer 20 is located in taping structure 64 with front side 34 of MEMS wafer 20 facing downwardly and abutting stop elements 84, and back side 36 of MEMS wafer 20 facing upwardly. Dicing tape 90 is laid over dicing frame 60 and back side 36 of MEMS wafer 20. Force is then applied to dicing tape 90 via rolling cylinder 94, to attach adhesive layer 92 of dicing tape 90 to back side 36 of MEMS wafer 20 and to secure dicing tape 90 to dicing frame 60. MEMS wafer 20 is now mounted to dicing tape 90 that, in turn, is mounted to dicing frame 60.

With reference back to FIG. 15, securing subprocess 120 may include a task 126 following tasks 122 and 124. Dicing frame 60 is flipped and secured to a saw chuck (126). A task 128 may be performed in conjunction with task 126. A surfactant material may be applied over the front side of MEMS wafer 20 (128).

Figure 17:
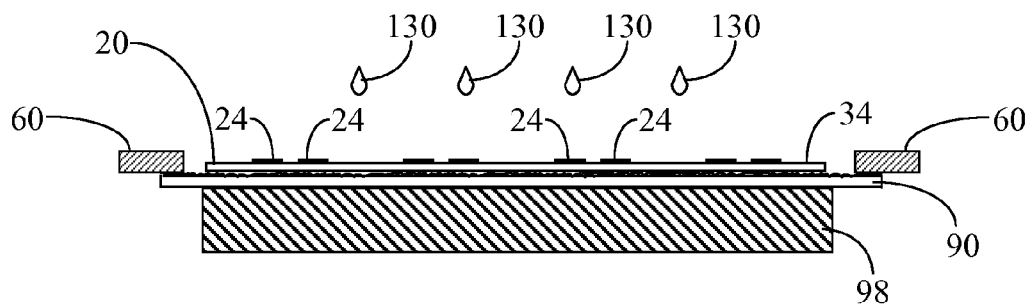
FIG. 17 shows a side view of the dicing frame and MEMS wafer from FIG. 16 during a subsequent stage of processing in accordance with the securing subprocess of FIG. 15.

FIG. 17 shows a side view of dicing frame 60 and MEMS wafer 20 during a subsequent stage of processing in accordance with tasks 126 and 128 of securing subprocess 120 (FIG. 15). In particular, dicing frame 60 is placed on saw chuck 98 with back side 36 of MEMS wafer facing saw chuck 98. Again, dicing tape 90 may be secured to saw chuck 98 via vacuum and/or, in some instances via an adhesive material (not shown) present on either of saw chuck 98 or on dicing tape 90. Dicing tape 90 and dicing frame 86 may alternatively be secured in saw chuck 98 by other means.

In an embodiment, a surfactant material 130 is applied over front side 34 of MEMS wafer 20 and MEMS structures 24. Surfactant material 130 can serve to reduce the surface tension between front side 34 of MEMS wafer 20 and any saw debris from the subsequent dicing operation 46 (FIG. 3) that may be trapped between MEMS wafer 20 and a protective material (not shown in FIG. 17) to be placed over MEMS structures 24 at front side 34 of MEMS wafer 20 in a subsequent operation. Thus, the saw debris may be less likely to stick or adhere to front side 34 of MEMS wafer 20 and MEMS structures 24 so that it can be readily cleaned away.

Referring back to FIG. 15, securing subprocess 120 may include a task 132 following tasks 126 and 128. Protective material is placed over front side 34 of MEMS wafer 20 (132).

Figure 18:
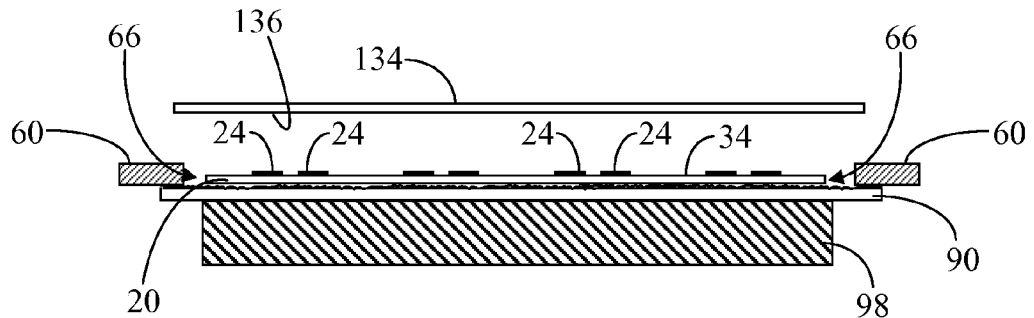
FIG. 18 shows a side view of a protective material being placed over the front side of the MEMS wafer from FIG. 17 during a subsequent stage of processing in accordance with the securing subprocess of FIG. 15.

FIG. 18 shows a side view of a protective material 134 being placed over front side 34 of MEMS wafer 20 during a subsequent stage of processing in accordance with task 132 of securing subprocess 120 (FIG. 15). Protective material 134 may be a tack-free mylar film, or some other suitable material having a tack-free surface 136. Protective material 134 is configured to generally extend beyond periphery 66 of MEMS wafer 20. The tack-free composition of surface 136 largely prevents the adhesion of protective material 134 to MEMS structures 24. Of course, the inclusion of surfactant material 130 (FIG. 17) between MEMS wafer 20 and protective material 134 further ensures that protective material 134 will not adhere to MEMS structures 24.

With reference back to FIG. 15, securing subprocess 120 may include a task 140 following task 132. Protective material 134 is secured to dicing tape 90 surrounding MEMS wafer 20 (140). Following execution of task 140, processing returns to MEMS wafer dicing process 40 (FIG. 3) so that MEMS wafer 20 (over which protective material 134 has been placed) can be diced at dicing task 46 (FIG. 3).

Figure 19:
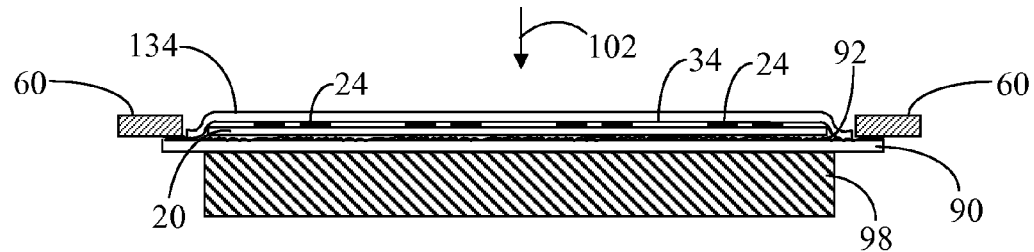
FIG. 19 shows a side view of the protective material from FIG. 18 attached to the dicing tape during a subsequent stage of processing in accordance with the securing subprocess of FIG. 15.

FIG. 19 shows a side view of protective material 134 attached to dicing tape 90 during a subsequent stage of processing in accordance with task 140 of securing subprocess 120 (FIG. 15). As mentioned previously, surface 136 of protective material 134 is tack-free, i.e., not sticky. However, dicing tape 90 includes adhesive layer 92 in order to adhere back side 36 of MEMS wafer 20 to dicing tape 90. Accordingly, in some embodiments, protective material 134 is adhered to dicing tape 90 about periphery 66 of MEMS wafer. That is, protective material 134 is attached to dicing tape via adhesive layer 92 on dicing tape 90. Attachment of protective material 134 to dicing tape 90 may result in a lower magnitude of compressive force 102 relative to compressive force 102 applied in accordance with securing subprocess 54 (FIG. 4). Nevertheless, protective material 134 can still protect MEMS structures 24 during dicing operation 46 (FIG. 3) of MEMS wafer dicing process 40 (FIG. 3).

Figure 20:
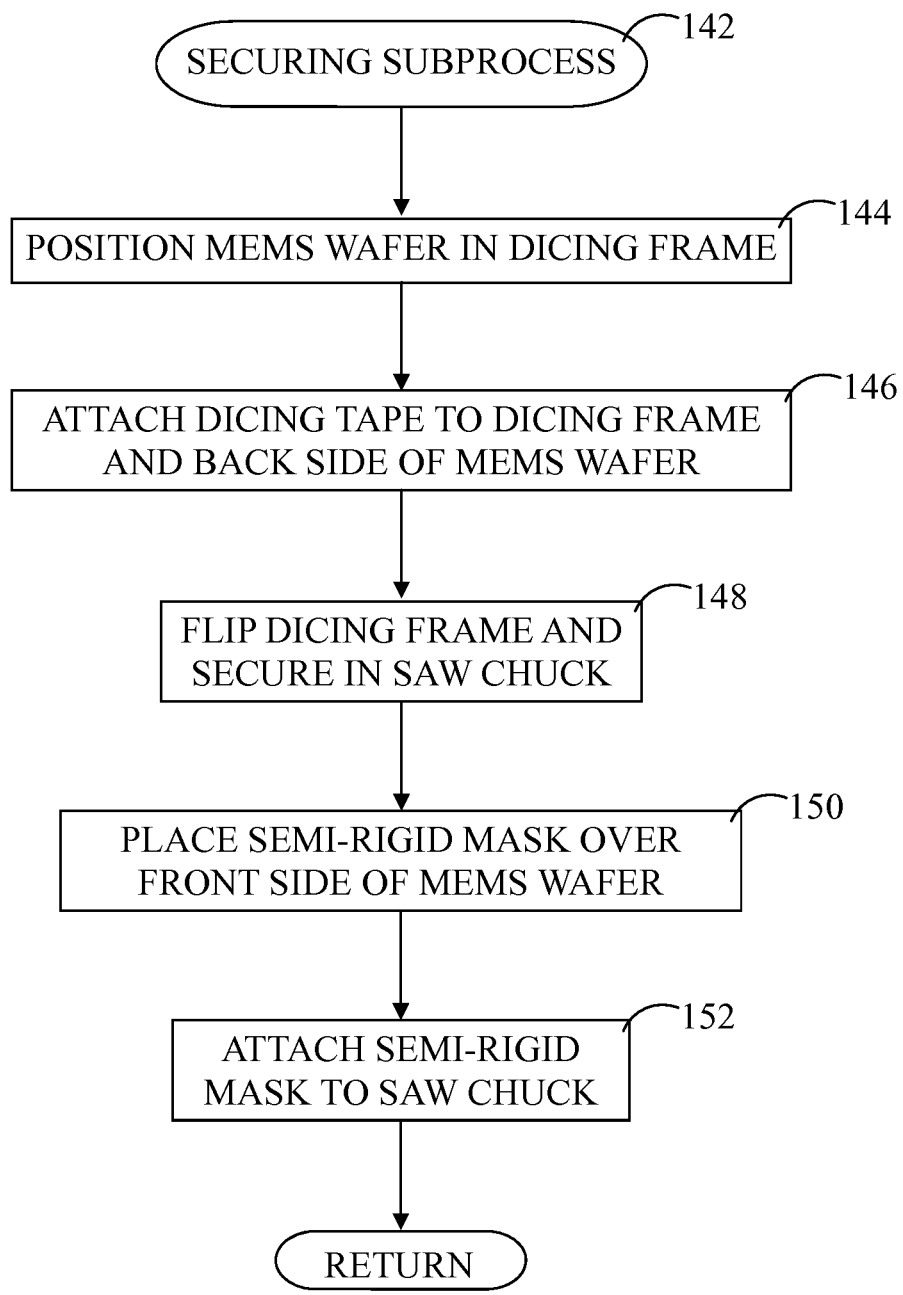
FIG. 20 shows a flowchart of a securing subprocess that may be executed in connection with the MEMS wafer dicing process of FIG. 3 in accordance with another embodiment.

FIG. 20 shows a flowchart of a securing subprocess 142 that may be executed in connection with task 44 (FIG. 3) of MEMS wafer dicing process 40 (FIG. 3) in accordance with another embodiment. Like securing subprocesses 54 (FIG. 4) and 120 (FIG. 15), securing subprocess 142 may be performed to enable the application of compressive force against MEMS structures 24 at task 44 of MEMS wafer dicing process 40. However, securing subprocess 142 utilizes a semi-rigid mask as a protective material in lieu of the flexible protective film materials used in connection with subprocesses 54, 120.

Securing subprocess 142 may begin with a task 144. MEMS wafer 20 is positioned in dicing frame 60 (FIG. 16) (144). A task 146 may be performed in conjunction with task 144. Dicing tape 90 is attached to dicing frame 60 and back side 36 of MEMS wafer 20 (146). Tasks 144, 146 correspond with tasks 122, 124 (FIG. 15) presented in securing subprocess 120 (FIG. 15) and illustrated in FIG. 16.

Securing subprocess 142 may include task 148 following tasks 144 and 146. Dicing frame 60 is flipped and secured in saw chuck 98 (FIG. 18) (148). Task 148 corresponds with task 126 (FIG. 15) of securing subprocess 120 (FIG. 15). Accordingly, further discussion need not be included herein for brevity.

Securing subprocess 142 may include a task 150 following task 148. A semi-rigid mask, serving as a protective material, is placed over front side 34 of MEMS wafer 20 (150). Securing subprocess 142 may include a task 152. The semi-rigid mask is attached to the saw chuck 98 in order to apply compressive force to MEMS structures 24 on front side 34 of MEMS wafer 20 (152).

Figure 21:
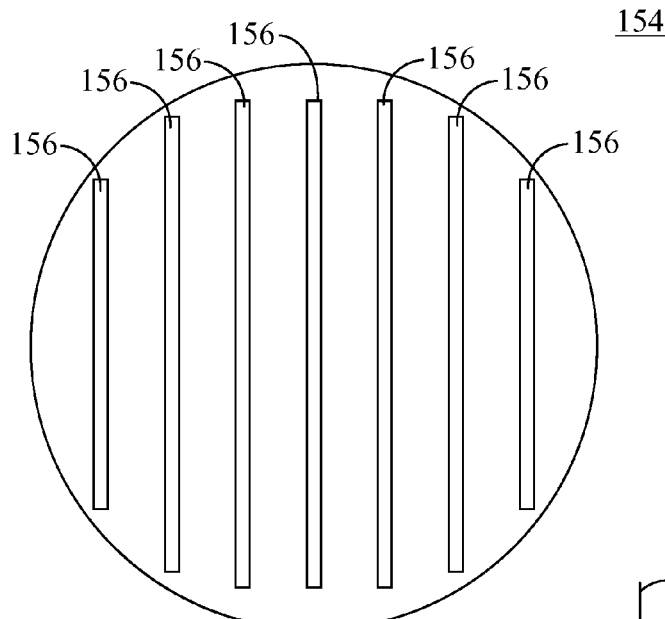
FIG. 21 shows a top view of a protective material in the form of a semi-rigid mask in accordance with an embodiment that may be utilized in connection with the securing subprocess of FIG. 20.

FIG. 21 shows a top view of a protective material in the form of a semi-rigid mask 154 in accordance with an embodiment that may be utilized in connection with task 150 (FIG. 20) of securing subprocess 142 (FIG. 20). In an embodiment, semi-rigid mask 154 can be sized to cover an entire surface area of front side 34 (FIG. 1) of MEMS wafer 20 (FIG. 1). Mask 154 may be metal, plastic, or any other suitable material that may be used to cover front side 34 of MEMS wafer 20. In an embodiment, mask 154 includes slots 156 extending through mask 154. These slots 156 may be formed to align with saw streets 30 (FIG. 1) in MEMS wafer 20.

Figure 22:
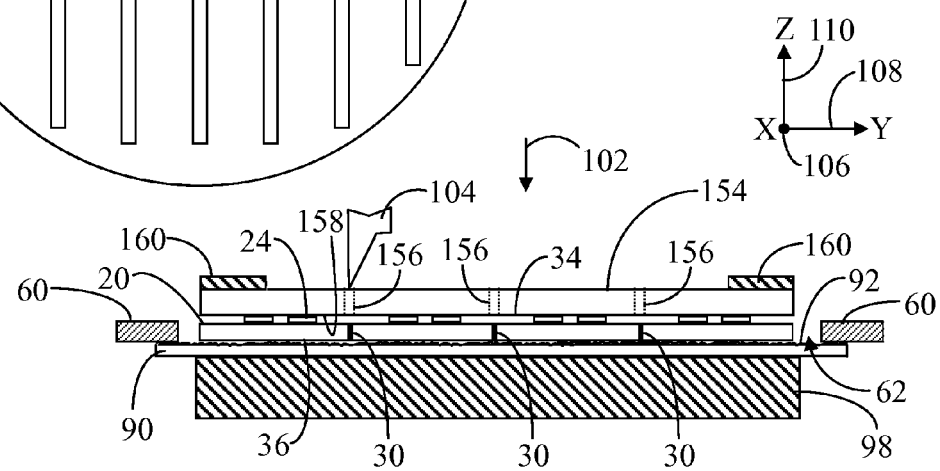
FIG. 22 shows a side view of the semi-rigid mask of FIG. 21 being used during processing in accordance with the securing subprocess of FIG. 20 and the MEMS wafer dicing process of FIG. 3.

FIG. 22 shows a side view of semi-rigid mask 154 being used during processing in accordance with securing subprocess 142 (FIG. 20) and MEMS wafer dicing process 40 (FIG. 3). As shown, MEMS wafer 20 is positioned in central opening 62 of dicing frame 60, and dicing tape 90 is attached to dicing frame 60 and back side 36 of MEMS wafer 20. Dicing frame 60 is secured in saw chuck 98 with back side 36 of MEMS wafer 20 facing saw chuck 98.

Semi-rigid mask 154 is placed over front side 34 of MEMS wafer in accordance with task 150 (FIG. 20) of securing subprocess 142, and semi-rigid mask 154 is attached to saw chuck 98 in accordance with task 152 of securing subprocess 142. In particular, a tack-free surface 158 of mask 154 is placed against MEMS structures 24 at front side 34 of MEMS wafer 20.

For simplicity, clamp elements 160 represent a portion of saw chuck 98 that may be used to attach semi-rigid mask 154 to saw chuck 98. As such, clamp elements 160 and saw chuck 98 are both illustrated using rightwardly and downwardly directed wide hatching. However, an attachment mechanism to saw chuck 98 can take a great number of forms in order to apply compressive force 102 against MEMS structures 24 on MEMS wafer 20. By way of example, the vacuum holding MEMS wafer 20 to saw chuck 98 may be sufficient to additionally hold mask 154 against MEMS wafer 20. Alternatively, mask 154 may include edges that extend downwardly and adhere to adhesive layer 92 on dicing tape 90 in order to attach semi-rigid mask 154 to saw chuck 98. And in still other embodiments, semi-rigid mask 154 may attach to a spindle feature (not shown) of saw chuck 98. Regardless of the particular attachment mechanism, attachment of semi-rigid mask 154 to saw chuck 98 applies pressure to semi-rigid mask 154 which, in turn, imparts compressive force against MEMS structures 24 to limit excessive movement of the movable MEMS structures during dicing in accordance with task 46 (FIG. 3) of MEMS wafer dicing process 40 (FIG. 3). Additionally, mask 154 can provide a physical barrier to the impact of the water spray and/or saw debris during execution of dicing task 46.

As further illustrated in FIG. 22, slots 156 (shown in dotted line form) extending through mask 154 are aligned with saw streets 30. At dicing task 46, saw blade 104 concurrently dices through mask 154 via slots 156 and through MEMS wafer 20 to produce the singulated MEMS dies 22 (FIG. 14). As shown in FIG. 21, mask 154 includes slots 156 that extend in a single direction. Accordingly, after dicing along all saw streets 30 that are parallel to one axis, e.g., X-axis 106, mask 154 may be removed and another mask (not shown) may be secured in its place, where the next mask includes slots that extend perpendicular to slots 156 and align with saw streets 30 that are parallel to another axis, e.g., Y-axis 108. Saw chuck 98 may be rotated approximately ninety degrees, and dicing task 46 may continue by dicing MEMS wafer 20 using the next mask in a direction substantially parallel to, for example, Y-axis 108. In alternative embodiments, however, the same mask 154 may be used when dicing in both directions by simply rotating mask 154 relative to MEMS wafer 20, and/or a single mask may include slots extending in both directions.

Figure 23:
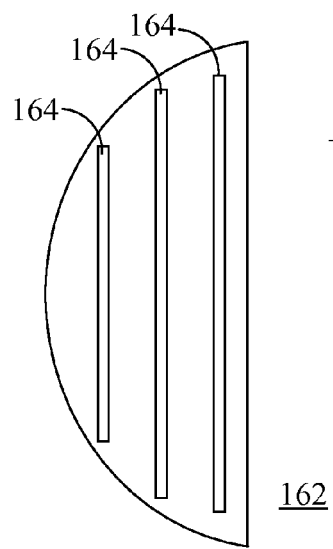
FIG. 23 shows a top view of a protective material in the form of a semi-rigid mask in accordance with another embodiment that may be utilized in connection with the securing subprocess of FIG. 20.

FIG. 23 shows a top view of a protective material in the form of another semi-rigid mask 162 in accordance with another embodiment that may be utilized in connection with tasks 150, 152 (FIG. 20) of securing subprocess 142 (FIG. 20). Mask 162 also includes slots 164 extending through mask 162. Again, these slots 164 may be formed to aligned with at least a portion of saw streets 30 (FIG. 1) in MEMS wafer 20. Mask 162 may be attached to saw chuck 98 via a variety of techniques as discussed above in connection with FIG. 22.

In the illustrated embodiment, semi-rigid mask 162 can be sized to cover only a portion of MEMS structures 24 at front side 34 (FIG. 1) of MEMS wafer 20 (FIG. 1) in order to shield an immediate dicing area of MEMS wafer 20. Mask 162 may be moved around or replaced as needed to shield the next immediate dicing area of MEMS wafer 20. It should be understood that a semi-rigid mask configured to cover only a portion of MEMS structures 24 at front side 34 of MEMS wafer 20 can be larger or smaller, or may have a different shape, than that depicted.

It is to be understood that certain ones of the process blocks depicted in FIGS. 3, 4, 15, and 20 may be performed in parallel with each other or with performing other processes. In addition, it is to be understood that the particular ordering of the process blocks depicted in FIGS. 3, 4, 15, and 20 may be modified, while achieving substantially the same result. Accordingly, such modifications are intended to be included within the scope of the inventive subject matter. In addition, although particular system configurations, including particular MEMS structures, are discussed in conjunction with FIGS. 1 and 2, above, embodiments may be implemented in MEMS wafers having other MEMS structure architectures, as well. These and other variations are intended to be included within the scope of the inventive subject matter.

Various embodiments entail methodology for shielding MEMS structures during dicing of a MEMS wafer in order to protect the MEMS structures from damage and particle contamination during a wafer dicing process. In particular, embodiments entail a fabrication operation in which a compressive force is applied against the MEMS structures using a temporary protective material, such as a protective film or a protective mask. A dicing operation concurrently dices through both of the protective material and the MEMS wafer. The protective material has a tack-free surface facing the MEMS structures. The compressive force largely limits excessive movement of the movable MEMS structures, thus making the MEMS structures less susceptible to fracture from either a point force as well as being restricted from fracture due to back and forth pulsation from the impact of the water spray during the dicing operation. Additionally, the protective material provides a physical barrier to the impact of the water spray and/or saw debris. Furthermore, since the protective material is tack-free, it cannot adhere to the MEMS structures on the front side of the MEMS wafer. Accordingly, following dicing, the protective material can simply be removed from the front side of the singulated MEMS dies, and the MEMS dies can continue on to the next step of processing. Thus, the methodology yields cost effective means for protecting the delicate MEMS structures from damage and/or contamination during front side wafer dicing.

While the principles of the inventive subject matter have been described above in connection with specific structure and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method comprising:
applying a compressive force against microelectromechanical systems (MEMS) structures located at a front side of a MEMS wafer using a protective material covering at least a portion of said front side of said MEMS wafer, wherein said applying comprises securing said protective material over said front side of said MEMS wafer, said securing applies pressure to said protective material to impart said compressive force against said MEMS structures, and said securing comprises:
 mounting said protective material to a dicing frame with said protective material spanning a central opening of said dicing frame;
 positioning said MEMS wafer in said central opening with said front side facing said protective material; and
 securing said dicing frame in a saw chuck with a back side of said MEMS wafer facing said saw chuck, wherein said securing said dicing frame applies said pressure to a periphery of said protective material via attachment to said saw chuck to impart said compressive force against said MEMS structures; and
dicing through said MEMS wafer from said front side to produce a plurality of MEMS dies, each of which includes at least one of said MEMS structures.

2. The method of claim 1 wherein said mounting comprises adhering an adhesive region of said protective material to said dicing frame with a tack-free region of said protective material spanning said central opening.

3. The method of claim 2 further comprising:
prior to said mounting, providing an adhesive on a surface of said protective material;
attaching said surface at said periphery of said protective material to said dicing frame to perform said adhering; and
following said adhering, reducing a tackiness of said adhesive over a remainder of said surface to form said tack-free region.

4. The method of claim 3 wherein said reducing comprises curing said remainder of said surface using ultraviolet radiation to reduce said tackiness of said adhesive.

5. A method comprising:
applying a compressive force against microelectromechanical systems (MEMS) structures located at a front side of a MEMS wafer using a protective material covering at least a portion of said front side of said MEMS wafer, wherein said applying comprises securing said protective material over said front side of said MEMS wafer, said securing applies pressure to said protective material to impart said compressive force against said MEMS structures, and said securing comprises:
 positioning said MEMS wafer in a central opening of a dicing frame;
 attaching dicing tape to said dicing frame and a back side of said MEMS wafer;
 placing a tack-free surface of said protective material over said front side of said MEMS wafer; and
 attaching said protective material to said dicing tape about a perimeter of said MEMS wafer to apply said pressure to said protective material; and
dicing through said MEMS wafer from said front side to produce a plurality of MEMS dies, each of which includes at least one of said MEMS structures.

6. A method comprising:
applying a compressive force against microelectromechanical systems (MEMS) structures located at a front side of a MEMS wafer using a protective material covering at least a portion of said front side of said MEMS wafer, wherein said applying comprises securing said protective material over said front side of said MEMS wafer, said securing applies pressure to said protective material to impart said compressive force against said MEMS structures, and said securing comprises:
 positioning said MEMS wafer in a central opening of a dicing frame;
 attaching dicing tape to said dicing frame and a back side of said MEMS wafer;
 securing said dicing frame in a saw chuck with said back side of said MEMS wafer facing said saw chuck;
 placing a tack-free surface of said semi-rigid mask over said front side of said MEMS wafer; and
 attaching said semi-rigid mask to said saw chuck to apply said pressure to said semi-rigid mask; and
dicing through said MEMS wafer from said front side to produce a plurality of MEMS dies, each of which includes at least one of said MEMS structures.

7. A method comprising:
applying a compressive force against microelectromechanical systems (MEMS) structures located at a front side of a MEMS wafer using a first protective material covering at least a portion of said front side of said MEMS wafer; and
dicing through said MEMS wafer from said front side to produce a plurality of MEMS dies, each of which includes at least one of said MEMS structures, wherein said dicing comprises:
 dicing in a first direction across a plane of said MEMS wafer through said first protective material and said MEMS wafer, said dicing in said first direction forming openings extending through said first protective material;
 placing a second protective material over said first protective material; and
 dicing in a second direction across said plane of said MEMS wafer through said second protective material, said first protective material, and said MEMS wafer to produce said plurality of MEMS dies.

* * * * *